United States Patent [19]

Fromson

[11] 3,839,037

[45] Oct. 1, 1974

[54] LIGHT-SENSITIVE STRUCTURE

[76] Inventor: Howard A. Fromson, Rogues Ridge Rd., Weston, Conn. 06880

[22] Filed: July 17, 1973

[21] Appl. No.: 380,019

Related U.S. Application Data

[62] Division of Ser. No. 171,052, Aug. 12, 1971, Pat. No. 3,773,514.

[52] U.S. Cl......................... 96/35.1, 96/36, 96/36.2, 96/36.3, 96/67, 96/86 R, 117/107, 117/71

[51] Int. Cl............................................... G03c 1/94

[58] Field of Search............. 117/34; 96/36, 86, 33, 96/35, 35.1, 36.2, 36.3, 67

[56] References Cited

UNITED STATES PATENTS

| | | | |
|---|---|---|---|
| 3,136,637 | 6/1964 | Larson | 96/33 |
| 3,458,311 | 7/1969 | Alles | 96/86 R |

*Primary Examiner*—Ronald H. Smith
*Assistant Examiner*—Edward C. Kimlin
*Attorney, Agent, or Firm*—Burgess, Dinklage & Sprung

[57] ABSTRACT

A light-sensitive composite especially useful in the printing and electronic circuit arts includes a substrate, a soluble light-sensitive coating thereon which becomes insoluble upon exposure to actinic radiation, or vice versa, and an ultra-thin tough, wear-resistant protective coating over the light-sensitive coating which will transmit actinic radiation for altering the solubility of areas of the light-sensitive coating and which is permeable to solvents for dissolving and removing areas of the light-sensitive coating which remain soluble after exposure to actinic radiation. The preferred protective coating is a vacuum deposited metal coating which is useful per se or provides a basis for further metal coatings such as electroless and electrolytic deposited metal coatings.

7 Claims, 5 Drawing Figures

LIGHT-SENSITIVE STRUCTURE

This is a division, of application Ser. No. 171,052, filed Aug. 12, 1971, now U.S. Pat. No. 3,773,514.

BACKGROUND

This invention relates to light-sensitive structures for faithfully reproducing images, designs, printed matter and the like using photochemical techniques. In particular this invention relates to light-sensitive structures useful in the printing and electronic circuit arts and more particularly to presensitized printing plates for planographic or letterpress printing.

Light-sensitive materials such as dichromated colloids and photopolymerizable compositions such as diazo resins have been widely used in photomechanical printing processes such as photoengraving, photogravure and photolithography as well as photomechanical processes outside the printing field such as in the manufacture of so-called "printed circuits" and labels, templates, registration tags, signs and the like.

Negative working, light-sensitive materials are applied or coated onto a suitable support or substrate and are of such a nature that before exposure to actinic radiation they are soluble in a particular solvent (usually water). When exposed to actinic radiation, however, the material becomes insoluble in the solvent. Other light-sensitive materials function just the opposite, that is, they are insoluble and become soluble upon exposure to actinic radiation. Positive working light-sensitive materials work just the opposite.

When a photographic negative or positive is placed over the unexposed light-sensitive layer and exposed to UV light for example, those areas of the layer protected from the UV light source by the denser or more opaque areas of the imaging means remain soluble while the exposed portions of the layer are insolubilized. The image is then developed by applying the solvent to remove the unexposed soluble areas of the layer. Generally speaking, such light sensitive materials are presently often diazo resin compositions. Older types of light-sensitive materials are based on egg albumin or gelatin binders containing dichromate sensitizers.

In the field of lithographic printing which depends on the mutual immiscibility of water and oleophilic inks, it is necessary that the support present a hydrophilic surface in those areas laid bare by removal of the unexposed portion of the light sensitive layer. Thus, one side of the support is often specially treated to render it hydrophilic. For instance, metallic supports are often "grained" by abrasive or etching processes or, anodized in the case of aluminum or aluminum alloy supports. Also, certain metals are known to react deleteriously with diazo compositions. To meet this problem such metal supports are often provided with a protective insoluble hydrophilic coating, such as sodium silicate, between the support and the light sensitive layer. The aqueous wetting characteristics of paper and polymer supports are often improved in a similar way by mineral filler coatings comprising a water insoluble polymer filled with titania. pigments such as silica or titania.a Printing plate constructions using light-sensitive materials are taught by the following patents:

U.S. Pat. No. 2,714,006, Jewitt et al, July 26, 1955;

U.S. Pat. No. 2,741,981, Frost, Apr. 17, 1956;

U.S. Pat. No. 2,791,504, Plambeck, May 7, 1957;

U.S. Pat. No. 3,062,648, Grawford, Nov. 6, 1962;

U.S. Pat. No. 3,181,461, Fromson, May 4, 1965;

U.S. Pat. No. 3,220,346, Stickler, Nov. 30, 1965;

U.S. Pat. No. 3,280,734, Fromson, Oct. 25, 1966; and

U.S. Pat. No. 3,338,164, Webers, Aug. 29, 1967.

A major problem associated with light-sensitive structures has been the durability of developed images especially in the printing arts where press life is a critical economic factor. Early efforts directed towards solving this problem involved reinforcing the image after it was developed by applying a durable coating in the image areas. However, such coatings had to be applied properly, skillfully and uniformly and failure to achieve any of these led to undesirable and often disasterous results. This prompted the development set forth in U.S. Pat. No. 3,136,637, Larson, June 9, 1964, of presensitized structures having a water-insoluble solvent-softenable polymer coating over the entire light-sensitive layer. After exposure to actinic light, the portions of the polymer coating overlying the soluble unexposed portions of the light-sensitive layer are removed with a suitable solvent and the soluble portions of the light-sensitive layer are removed with a second solvent which is generally water. This approach has certain drawbacks in that an additional solvent must be used to develop the image. Moreover, this solvent contacts the entire polymer coating which can lead to deleterious effects in the portions of the polymer coating that remain over the exposed insoluble image areas of the light-sensitive layer.

Another earlier approach involving coating the entire light-sensitive layer before imaging is set forth in U.S. Pat. No. 1,992,965, Rowell, Mar. 5, 1935. Here, however, a film of waxy material is applied in thicknesses of two or three ten thousandths of an inch to maintain and preserve the actinic sensitiveness and surface continuity of chromated colloid films. This waxy film perservative, which is actually less durable than the chromated colloid film, is removed with a solvent after exposure to actinic light so that the colloid can be developed with water or is made water-permeable by laying down a wax emulsion and removing the water. In the latter instance, water passes through the waxy film and removes the soluble portions of the colloid film as well as the overlying portions of the waxy film. This is undesirable, however, because it leaves less durable wax over the more durable image areas of the colloid film. The better approach is to remove the wax entirely once the need to preserve the unexposed colloid film no longer exists.

The problem of durability of the light-sensitive material is especially acute in the field of lithographic printing. While offset lithography represents one of the most widely practiced of the printing arts, it is nevertheless generally limited to applications where relatively short press runs are acceptable. This is due principally to the abrasive action of the pigments employed in offset inks coupled with the physical interaction between the blanket cylinder and the plate master cylinder which results in relatively rapid wear of the oleophilic image areas of the printing plate. Thus, conventional photolithography while highly desirable in many respects does not compete effectively with letterpress printing for large volume printing applications. Certain highly developed lighographic plates such as deep etched and bi-metallic plates had been found to be successful for large volume printing applications. However, these plates require lengthy and costly procedures to prepare same, making them prohibitive for conventional lithographic printing runs.

SUMMARY

The present invention provides light-sensitive structures wherein the durability of the light-sensitive material is not only greatly improved but also provides a building block for further reinforcing the developed image and/or for readily fabricating further structures using widely practiced metal deposition techniques. Also, in a more specific aspect the present invention provides a presensitized lithographic printing plate having a hard, durable, abrasion and wear-resistant coating thereon that requires no additional solvents or procedural steps to ready the plate for the press.

The light-sensitive structure of the invention broadly comprises (a) a substrate; (b) a light-sensitive coating on said substrate having one solubility in relation to a solvent in a state before exposure to actinic radiation and another solubility in relation to said solvent in another state after exposure to actinic radiation, said light-sensitive coating being soluble in said solvent in one of said states and being insoluble in said solvent in its other state; and (c) a tough, wear-resistant, protective layer over said light-sensitive material which will transmit actinic radiation for altering the solubility of areas of the light-sensitive coating with respect to said solvent and which is permeable to said solvent for dissolving the areas of said light-sensitive coating soluble in said solvent after exposure to actinic radiation.

The protective layer is preferably formed from an inorganic material selected from the group of metals and inorganic metal compounds and mixtures of these. The protective layer is also preferably vacuum deposited and in a highly preferred embodiment the protective layer is a vacuum deposited metal layer to which has been applied a layer of electroless deposited metal after exposure of the lightsensitive layer and removal of the soluble areas of the light-sensitive layer and the portion of the protective layer overlying the soluble areas. Following this, the structure may be electroplated over the electroless metal layer and/or the substrate may be metal and may be etched using conventional techniques in the areas laid bare by removal of the unexposed areas of the light sensitive layer.

The process of this invention comprises coating a substrate having a light-sensitive layer thereon having one solubility in relation to a solvent in a state before exposure to actinic radiation and another solubility in relation to said solvent in another state after exposure to actinic radiation, said light-sensitive coating being soluble in said solvent in one of said states and being insoluble in said solvent in its other state, with a tough, wear-resistant, preferably vacuum deposited protective layer which will transmit actinic radiation for altering the solubility of areas of the light-sensitive layer with respect to said solvent and which is permeable to said solvent for dissolving the areas of said light-sensitive layer soluble in said solvent after exposure to actinic radiation.

The process of the invention also embodies the additional steps of depositing an electroless metal layer on the protective layer, electroplating over said electroless deposited metal and/or etching the substrate.

DESCRIPTION OF THE DRAWING

In the accompanying drawing schematic edge-on views are shown and the thicknesses of the various layers have been greatly exaggerated for ease of understanding, it being understood that in practice these layers are relatively thin and that the protective layer is ultra-thin.

DESCRIPTION

Figure 1:
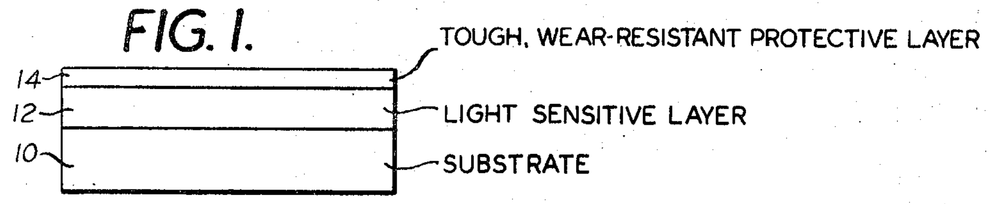
In FIG. 1, substrate 10 is shown having an unexposed light-sensitive layer 12 thereon over which is applied a protective layer 14.
Figure 2:
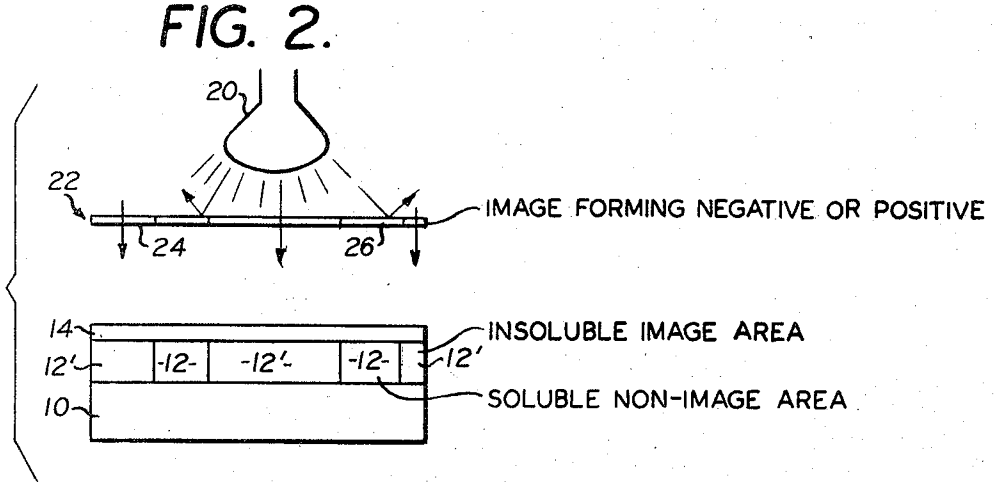
In FIG. 2, the light-sensitive structure of FIG. 1 is shown positioned below an image forming negative or positive 22 above which is a source 20 of actinic radiation. Actinic radiation passes through portions 24 of the member 22 and are blocked in portions 26 of member 22. Actinic radiation passing through the portions 24 form insoluble image areas 12' and leave soluble non-image areas 12.

The light-sensitive coating or layer will be referred to herein for ease in understanding as being soluble in relation to a solvent before exposure to actinic radiation and insoluble with respect to said solvent after exposure to actinic radiation, it being understood that light-sensitive materials which behave in the opposite manner, that is first insoluble and then soluble after exposure, are within the purview of the present invention.

In general, the substrate used in the present invention is a sheet or a laminate which may be rigid or flexible with varying thicknesses depending on the use intended. The substrate may be a synthetic resin sized paper, plastic film or sheet, metallic sheets or foils or papers and textiles formed from natural or synthetic fibers or filaments. Where the light sensitive structure of the invention is utilized in the printing arts, the principle requirements of the substrate are that it be flexible for mounting on various imaging or printing devices and that it have sufficient wet strength to maintain dimensional stability during the printing operation. Particularly, suitable substrates for printing plates are those described in my aforementioned Pat. Nos. 3,181,461 and 3,280,734. These substrates are an aluminum sheet having an aluminum oxide coating and a layer thereover formed by the reaction of the aluminum oxide coating with an alkali metal silicate applied thereto and an aluminum sheet having an aluminum oxide coating having a substratum formed in the pores of the aluminum oxide coating. Particularly preferred for such substrates are water soluble dyes capable of dying the aluminum oxide coating such as Aluminum-Copper BD sold by Sandoz Co.

The light-sensitive layer or coating used in the structure of this invention may be formed from a host of photochemical materials known in the art. Such light-sensitive materials include dichromated colloids, such as those based on organic colloids, gelatin, process glue, albumens, caseins, natural gums, starch and its derivatives, synthetic resins, such as polyvinyl alcohol and the like; unsaturated compounds such as those based on cinnamic acid and its derivatives, chalcone type compounds, stilbene compounds and the like; and photopolymerizable compositions, a wide variety of polymers including vinyl polymers and copolymers such as polyvinyl alcohol, polyvinyl acetals, polyvinyl acetate vinyl sorbate, polyvinyl ester acetal, polyvinyl pyrrolidone, polyvinyl butyrol, halogenated polyvinyl alcohol; cellulose based polymers such as cellulose-acetate hydrogenphthalate, cellulose alkyl ethers; urea-formaldehyde resins; polyamide condensation polymers; polyethylene oxides; polyalkylene ethers; polyhexamethylene adipamide; polychlorophene; polyethylene glycols, and the like. Such compositions utilize as initiators carbonyl compounds, organic sulphur compounds, peroxides, redox systems, azo and diazo compounds, halogen compounds and the like. These and other photochemical materials including their chemistry and uses are discussed in detail in a text entitled "Light-Sensitive Systems," Jaromir Kosar, John Wiley and Sons, Inc., New York, 1965. Diazo resins are particularly preferred in those instances where the light-sensitive structure is utilized as a printing plate for lithographic or letterpress printing.

The protective layer used in the structure of the invention is solvent insoluble, ultra-thin and poriforous. The thickness of the protective layer may range from a layer which is atomic in dimension, that is 1 molecule thick up to a thickness of about 1.5 microns. The protective layer preferably has a thickness of from about 2,000 to about 15,000 Angstroms and more preferably from about 4,000 to about 10,000 Angstroms.

The thickness of the protective coating of the present invention can also be expressed as a function of the wave length of the actinic radiation utilized to expose the light-sensitive layer. It has been found that generally the thickness of the protective layer should not be greater than about 10 times the wave length of the actinic radiation and preferably not greater than 5 times the wave length. By definition, actinic radiation is that which will initiate a photochemical reaction and includes x-rays, infrared, visible light and ultraviolet light. Generally, speaking, an intense source of visible and/or ultraviolet light is used.

As indicated previously, the protective layer is preferably formed from metals, inorganic metal compounds or mixtures of these. The thickness of the protective layer must be such that it is capable of transmitting actinic radiation for altering the solubility of areas of the light-sensitive coating and is permeable to solvents for dissolving the soluble areas of the light-sensitive coating not exposed to actinic radiation.

The protective layer may be formed from a transparent material, for example, calcium fluoride or magnesium fluoride or from a non-transparent material such as copper, aluminum, gold or silver. Generally, the transparent materials are applied in thicknesses approaching one micron and must retain sufficient porosity to permit rapid penetration of solvents to remove the unexposed areas of the light-sensitive layer in commercially acceptable times. The non-transparent materials on the other hand are deposited in thicknesses within the ranges specified above such that there is at least 5 percent and preferably at least 30 percent transparency so as to transmit actinic radiation to the underlying light-sensitive layer and form an image therein in commercially acceptable times.

The protective layer according to this invention may be metal or the inorganic compounds thereof selected from the group of the metals of Groups I B, II B, III A, IV A, VI B, VII, of the Periodic Chart, the alkali metals and the alkaline earth metals. Two or more metals may be used in combination to form the protective coating. Also inorganic compounds of any of the foregoing metals may be used alone, or in combination, with other inorganic metal compounds or in combination with one or more metals per se. Suitable inorganic compounds include the halides, preferably the fluorides and the oxides of the foregoing metals. Also suitable are compounds which will decompose or chemically change into the metal per se or its halide or oxide during coating. Examples of preferred metals and inorganic metal compounds for the protective coating include chromium, chromium oxide, copper, aluminum, gold, gold alloys, silver, magnesium fluoride, calcium fluoride, strontium fluoride, zinc, alumina, platinum, platinum oxide, copper oxide, iron, cobalt and nickel.

In those instances wherein the light-sensitive structure of the invention is utilized as a negative or positive working printing plate, it is preferred that the protective layer be formed from a water insoluble, oleophilic and hydrophobic material such as copper, gold, and alloys thereof.

To insure that the protective layer of the invention will be tough and abrasion and wear-resistant, the layer is preferably formed from a metal or inorganic metal compound having a Moh's hardness of at least 1. These materials are further characterized by being substantially water and solvent insoluble.

The protective coating according to the present invention can be applied or deposited using coating techniques which result in uniform deposition of the protective coating material on the light-sensitive layer and which will not adversely affect the light sensitive layer such as by premature exposure or rendering same insoluble. Suitable coating techniques include solution or emulsion coating followed by removal of the coating vehicle, vacuum coating, sputtering, ion plating, gas plating, and metallized coatings produced by spray metal techniques. It is also possible to apply the protective coating by carrying out a chemical reaction on the surface of a light-sensitive layer. For example, the light sensitive-layer can be coated with a solution of an alkali metal fluoride which in turn is treated with alkaline earth metal ions so as to precipitate out the alkaline earth metal fluoride by a replacement mechanism.

Because of the ultra-thin nature of the protective layer of this invention and the sensitivity of the light-sensitive layer, the preferred coating technique is vacuum coating. This technique is preferred because the substrate with the light-sensitive layer thereon can remain dry and need not be heated during the coating step. In vacuum coating, metal particles or particles of inorganic metal compounds are deposited by vacuum distillation over the light-sensitive layer to form the protective layer. The substrate with the light-sensitive layer thereon is placed in a coating chamber which is evacuated to eliminate molecular interference between the source of the coating material and the surface to be coated. Readily high vacuum pumps or diffusion pumps may be used to evacuate the coating chamber. The coating material is heated intensely, for example, by resistance, induction or electron beam methods, so that it vaporizes and travels from the course to the substrate with the light-sensitive coating thereon. The high vacuum facilitates evaporation of the coating material and the absence of air in the coating chamber permits the vaporized coating material to travel directly to the relatively cool coated substrate where it condenses to form poroforic adherent layer having a thickness in the range mentioned above. Vacuum coating is especially preferred since it may be carried out in a continuous manner wherein a roll of flexible substrate such as aluminum foil or sheet having a light-sensitive layer thereon is continuously passed over the vapor source in the coating chamber. Processes for vacuum coating are well known as disclosed for example in U.S. Pat. Nos. 2,206,020; 2,562,182; 2,622,041; 2,635,579; 2,643,201; 2,664,852; 2,664,853; 2,665,233-9; 2,665,320; 2,963,521; 2,903,544; and 3,562,141.

Metals readily deposited by vacuum coating normally have a deposition constant of at least $5 \times 10^{-6}$ grams per square centimeter per second at 1 micron pressure (absolute). Metals especially suited for vacuum coating include aluminum, silver, gold, lead, zinc, chromium, nickel, copper, tin, iron, platinum and the like.

The above-mentioned coating techniques are well known and widely practiced in the art. Details regarding these techniques including vacuum coating in addition to the above mentioned patents may be found in "Kirk-Othmer Encyclopedia of Chemical Technology," 2nd Edition, Interscience Publishers, New York, 1967, Vol. 13, pages 249 through 284.

The light-sensitive structure of the invention may be used directly, for example, as a lithographic printing plate in view of the fact that the metal or inorganic metal compound protective layer is insoluble in water, hydrophobic or organophilic. The light-sensitive structure can be imaged and developed in the conventional way as for presently used presensitized lithographic printing plates without using additional solvents or procedural steps.

Figure 3:
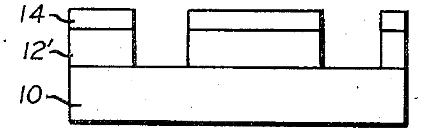
In FIG. 3, the exposed light-sensitive structure of FIG. 2 is shown with the soluble non-image areas removed along with the portions of the protective layer 14 laying over these soluble areas.
Figure 4:
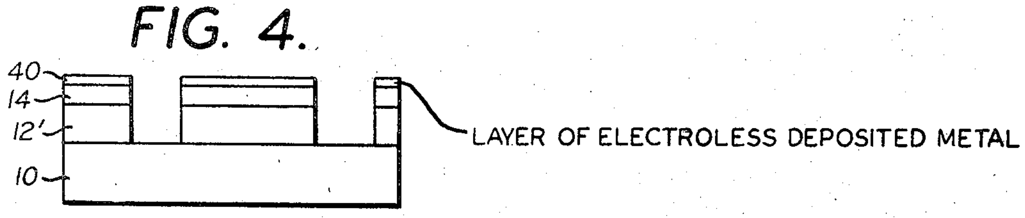
In FIG. 4, a layer of electroless deposited metal 40 is shown applied to the protective layer 14 which remains over the insoluble image areas 12'.

In many instances it is desirable to further reinforce the developed light-sensitive structure. This can be done by utilizing a metal for the protective layer and using conventional electrodeposition techniques, depositing further metal coatings onto the protective metal layer after exposure of the light-sensitive layer therethrough and removal of the soluble areas of the light-sensitive layer and the portion of the protective layer overlying the soluble areas. An especially suitable electrodeposition technique as referred to is electroless plating and is desirable since the initial protective layer need only be thick enough for the electroless deposited metal to bridge molecules in the protective layer. Such electroless plating techniques are well-known and widely practiced in the art. For example, protective metal layers according to the invention formed from copper, aluminum, nickel, gold, molybdenum, iron, tin, and platinum will catalyze the electroless chemical reduction deposition of copper, nickel, cobalt, lead, platinum, iron, silver, aluminum, gold, palladium, and magnesium among others. Protective layers formed from cobalt, nickel and iron will also catalyze the deposition of chromium. The preferred metal for electroless deposition is copper which can be accomplished by immersing the light-sensitive structure shown in FIG. 3, for example, in an electroless copper bath containing copper salt, complexing agents to keep the copper in solution and a reducing agent. The electroless clad light-sensitive structure of the present invention is shown in FIG. 4, for example, is especially suited for use as a lithographic printing plate and makes possible long press runs. For example, such a lithographic plate comprising an aluminum sheet having an aluminum oxide coating and a layer thereover formed by the reaction of the aluminum oxide coating with sodium silicate, a diazo resin layer, a vacuum deposited aluminum protective layer and an electroless deposited copper layer is capable of press runs an excess of 150,000 impressions. Conventional lithographic printing plates are generally only capable of press runs of 25,000 to 75,000 impressions and even those plates with a durable polymeric coating according to the teachings of Larson mentioned above are generally only capable of press runs of about 100,000 impressions.

Figure 5:
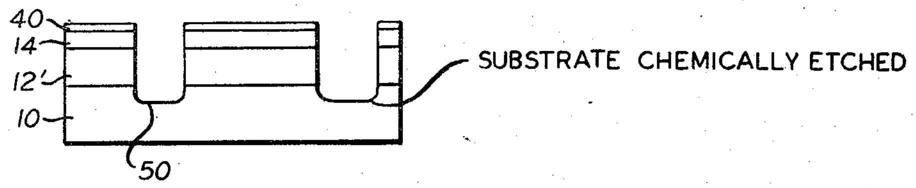
In FIG. 5, the structure of FIG. 4 is shown etched in the base at 50.

The structure shown in FIG. 4 may also be utilized to fabricate further structures such as letterpress printing plates. This can be accomplished by electroplating the electroless metal layer 40 to build up a relief image and/or by etching the substrate 10 with a liquid which only selectively etches the substrate and does not affect the protective layer 14 or the electroless layer 40. An etched structure is illustrated in FIG. 5 of the drawing. Electroplating can be carried out using conventional techniques such as set forth in "Kirk-Othmer Encyclopedia of Chemical Technology," 2nd Edition, Interscience Publishers, New York, 1965, Vol. 8, pages 36–74.

Etching of the substrate 10 may be carried out utilizing conventional chemical etching techniques utilizing acetic or basic etching liquids. For example, aluminum and alumina can be satisfactorily etched with solutions of sodium hydroxide at room temperature. Other well known etching solutions and techniques can also be employed. It is important, however, that the protective layer 14 and the electroless layer 40 be inert to the etching liquid for the substrate 10.

A highly preferred structure according to the present invention comprises an aluminum substrate anodized to form an aluminum oxide coating thereon which is preferably further treated to render it hydrophilic, a diazo resin light-sensitive layer and a vacuum deposited copper or copper-gold alloy protective layer having a thickness of about 4,000 to about 10,000 Angstroms and at least about 30 percent transparency. Once the diazo resin has been exposed and the soluble regions removed the remaining protective layer in the image areas can be reinforced by depositing additional copper from an electroless bath containing a copper salt and a reducing agent. At this point, a relief image can be built up by electroplating the electroless layer with a copper alloy such as brass and/or by etching the aluminum substrate with an alkali metal hydroxide such as sodium hydroxide. To further increase the press life of a letterpress printing plate, the electroplated layer or electroless layer can be electroplated with a thin layer of a hard and wear-resistant metal such as nickel or chromium.

An important feature of the present invention when utilized in the printing arts is that a presensitized plate having a protective layer can be used in the same manner as present conventional presensitized plates without the need to use additional solvents such as are used with polymer coated plates or additional process steps.

Besides the printing arts, the present invention finds particular application in the making of printed circuits by a greatly simplified procedure. For example, a substrate which is an insulator such as phenolic board can be sensitized with a diazo resin and vacuum coated with copper as described herein. This structure is then exposed through a stencil whereby the desired conductive or circuit areas are light struck. The unexposed, soluble portions are removed by washing with water and the remaining printed circuit is electroless plated with copper using a bath containing a coper salt and a reducing agent. If a thicker metal layer is required, the electroless copper can be electroplated with copper. This method of preparing printed circuits does away with the need for an etchant and wastes relatively minor amounts of conductive metal. In conventional printed circuit processes, the non-circuit areas are etched away. In the present invention, the desired circuit areas are formed directly without etching resulting in greatly improved economics for the conductive metal utilized.

The present invention can also be used to make thin metal parts and, especially, such parts which must be made out of precious metal such as gold, by using a substrate from which the insoluble light-sensitive material with a metal protective coating thereover, which is generally electroless plated and may also be electroplated, is readily peelable. Examples of such metal parts include dial faces, gold letters and the like and examples of such substrates include phenolic board, Teflon coated metal sheet and the like.

The following examples are intended to further illustrate the present invention without limiting the same in any manner.

GENERAL COATING PROCEDURE

Protective layers according to the present invention are vacuum deposited using a bell jar coater in which a single sample is exposed to a resistance heated vapor source while under vacuum. Larger vacuum chambers can also be used for coating continuous strip. The sample to be coated is held against a plate at distances ranging between about 10 and 20 inches depending on the material being vacuum coated. A resistance heated tungsten wire or a molybdenum strip formed into a boat shape so as to contain the material to be evaporated is utilized. Between the vacuum source and the work, a moveable baffle is interposed to allow the material being deposited to attain the proper vaporizing temperature prior to exposure and to time the length of the vacuum coating. The baffle prevents the deposition of powdery or non-adherent coatings which can occur before full vaporizing temperature is reached. The bell jar coater is also provided with sight ports to permit measurements of the vapor source temperature and observation of the melt source itself during the coating operation.

In actual operation, an anodized aluminum sheet having a suitably prepared anodized coating is presensitized with a diazo resin and taped to the plate in a darkened room. A small glass slide strip alongside the presensitized plate permits ready measurement of the vacuum deposited coating. Care must be taken to keep the presensitized plate shielded from light while placing it in the bell jar coater. Once the coater is closed, the vacuum pump is started and after a vacuum of about 0.1 $\mu$ is achieved the heat is turned on to melt the material to be vacuum deposited. When the melt reaches the proper vaporizing temperature, the shutter is opened for a period of time sufficient to deposit a coating of the thickness desired.

GENERAL PRINTING PROCEDURE

Vacuum coated, presensitized aluminum-diazo resin printing plates are contact exposed in a vacuum frame through a photographic negative or positive in the conventional way. The exposed plate is then developed in the usual way using a solvent which is suitable for the diazo resin employed, e.g. a water and gum arabic solution, alcohol developers, alkaline developers and the like. The developed plate is locked up on the roll of an offset type lithographic printing apparatus and printing on paper is carried out in the usual way.

EXAMPLE 1

The general coating procedure is employed to vacuum deposit gold under a vacuum of 0.35 at 35 volts for 1 second. The gold coating was 35 percent transparent and, after exposure through a test negative, the plate was developed using water and gum arabic. Several prints of good quality are then printed using the general printing procedure.

EXAMPLE 2

Example 1 is duplicated except that an alloy containing 60 percent by weight gold and 40 percent by weight copper is employed to obtain a coating which is 33 percent transparent. Also, an alcohol/water solution is used to develop the plate. Several prints of good quality are then obtained following the general printing procedure.

EXAMPLE 3

The plates prepared in Examples 1 and 2 are each electroless plated with copper after being developed using a plating bath containing copper sulfate and a reducing agent for the copper. Several prints of good quality are obtained using electroless plated plates following the general printing procedure.

EXAMPLES 4–8

Employing the general coating procedure the following materials are vacuum deposited using the conditions indicated:

| Example No. | Vacuum Coating | Heating Voltage | Coating Time |
|---|---|---|---|
| 4 | Copper | 35 V. | 3.5 sec. |
| 5 | Silver | 35 V. | 3 sec. |
| 6 | Gold | 35 V. | 3 sec. |
| 7 | $CaF_2$ | 38 V. | 30 sec. |
| 8 | $CaF_2$ | 40 V. | 20 sec. |

The coatings in Examples 4, 5 and 6 were approximately 50, 53, and 49 percent transparent while the coatings of Examples 7 and 8 are inherently transparent. In each of the above Examples, prints of good quality are obtained following the general printing procedure.

EXAMPLE 9

A 10 × 15 inch photosensitive lithographic printing plate comprising a silicate-treated anodized aluminum support and a diazo sensitizer coating is vacuum coated with calcium fluoride following the general coating procedure. About one-half of its surface is masked by a glass plate taped thereover, while the remainder is bared. The calcium fluoride charge, residing in a molybdenum boat, is positioned under the closed baffle and about 10 inches below the printing plate. The jar is sealed, pumped down to about 0.1 torr pressure and the calcium fluoride charge heated to and maintained at about 1350°C by resistance heating of the molybdenum boat. The baffle is then opened and the printing plate is exposed for about 60 seconds under these conditions. During the treatment, the printing plate remains at about room temperature. The baffle is closed at the end of the 60 second exposure period, resistance heating of the calcium fluoride charge arrested and, when cooled, the entire system vented to the atmosphere. The thickness of the calcium fluoride coating deposited on the exposed emulsion surface is determined by interferometric analysis of the coating on the glass mask and is found to have a depth of about 6000 Angstroms.

Next, the photosensitive printing plate is contact exposed in a vacuum frame employing an 8 × 10 inch photographic negative bearing an image of a semi-log graph. The exposed plate is then developed in a water and gum arabic solution, and locked up on the plate roll of an offset type printing apparatus. A printing run of 52,000 copies is then run off. It is noted that the beginning copies of the run are of excellent overall quality and display little or no different in printing qualities with respect to the fluoride coated versus the uncoated portions of the printing plate. Those copies examined from the terminal segment of the run, however, disclose substantial differences in the printing qualities of the respective portions of the printing plate. Specifically, that portion of the copy printed with the uncoated portion of the printing plate is found to be substantially degraded as compared to the initial copies. Line sharpness and density are substantially reduced and many gaps or unprinted areas are evident. Conversely, that portion of the copy printed from the calcium fluoride coated portion of the plate is found to be little degraded and compares favorably with the copies taken from the initial segment of the run. The line density, integrity and sharpness of the image printed by the fluoride coated portion of the plate are of excellent quality.

EXAMPLE 10

An aluminum sheet anodized to form an aluminum coating thereon and treated with sodium silicate is coated with a diazo resin sensitizer in the usual way known in the art. This presensitized plate is vacuum coated with copper using the general coating procedure to form a protective layer over the diazo resin with 50 percent transparency. The coated plate is exposed and developed using a water and gum arabic solution according to the general printing procedure. Prints of good quality are obtained again following the general printing procedure.

EXAMPLE 11

A developed plate according to Example 10 is electroless plated with copper using a plating bath containing copper sulfate and a reducing agent for the copper. Several prints of good quality are obtained using the electroless plated plate according to the general printing procedure.

EXAMPLE 12

An electroless plated plate prepared according to Examples 10 and 11 is electroplated with copper using conventional techniques. This plate is then used in a letterpress printing process to make prints of excellent quality.

EXAMPLE 13

The aluminum substrate of plates prepared according to Examples 10 and 11 and Example 12 are etched with aqueous sodium hydroxide in the areas exposed by removal of the unexposed areas of the diazo resin. These plates are then used in conventional lithographic and letterpress printing processes to produce prints of excellent quality.

EXAMPLE 14

The following Example illustrates manufacture of printed circuits according to the present invention. A phenolic board substrate sensitized with a positive working diazo resin is vacuum coated with copper according to the general coating procedure to form a protective layer which is 50 percent transparent. This structure is then exposed in a vacuum frame through a stencil which defines a printed circuit. The exposed soluble portions of the diazo resin are removed by washing with an aqueous sodium carbonate and the developed plate is electroless plated with copper in the areas exposed through the stencil using a bath containing copper sulfate and a reducing agent for the copper. Leads are then attached to the printed circuit to establish the electrical integrity of the same. The printed circuit is then electroplated with copper to provide a more rugged printed circuit and the electrical integrity established as above.

As used herein the terms "soluble" and "insoluble" are intended to convey the meaning generally accepted and understood in the art of exposing and developing images utilizing light-sensitive systems. For example, a light-sensitive material is considered to be soluble when it can be readily removed by washing with a particular solvent at normal operating temperatures such as room temperature and insoluble when it is not removed upon exposure to a particular solvent under the same or similar temperature conditions.

I claim:

1. Process for making a light-sensitive structure having a thin, wear-resistant, protective coating which comprises coating a substrate having a light-sensitive layer thereon having one solubility in relation to a solvent in a state before exposure to actinic radiation and another solubility in relation to said solvent in another state after exposure to actinic radiation, said light-sensitive coating being soluble in said solvent in one of said states and being insoluble in said solvent in its other state, with a tough, wear-resistant, solvent insoluble, poriferous protective layer formed from a substance selected from the group of metals, inorganic metal compounds and mixtures of the foregoing over said light-sensitive material which will transmit actinic radiation for altering the solubility of areas of the light-sensitive layer with respect to said solvent and which is permeable to said solvent for dissolving the areas of said light-sensitive layer soluble in said solvent after exposure to actinic radiation.

2. Process of claim 1 wherein said protective layer is vacuum deposited from a substance selected from the group of metals, inorganic metal compounds and mixtures of the foregoing.

3. Process of claim 1 wherein the protective layer is a vacuum deposited metal to which is applied a layer of electroless deposited metal after exposure of the light-sensitive layer to actinic radiation and removal of the soluble areas of the light-sensitive layer and the portion of the protective layer overlying the soluble areas.

4. Process of claim 3 which includes the step of electroplating the electroless deposited metal.

5. Process of claim 3 which includes the step of etching the substrate in the areas exposed by removal of the soluble areas of the light-sensitive layer.

6. Process of claim 3 for making a printed circuit wherein the substrate is an insulator.

7. Process of claim 6 wherein the substrate is phenolic board and the protective layer and electroless deposited metal are copper.

* * * * *

UNITED STATES PATENT OFFICE
CERTIFICATE OF CORRECTION

Patent No. 3,839,037 Dated October 1, 1974

Inventor(s) Howard A. Fromson

It is certified that error appears in the above-identified patent and that said Letters Patent are hereby corrected as shown below:

Column 1, line 59 ater "filler coatings" insert
--or coatings--;

Column 1, line 61 "titania" should read --hydrophilic--;

Column 1, line 62 after "titania." delete --a--;

Column 5, line 28 "poriforous" should read --poriferous--;

Column 7, line 7 after "form" insert --a--.

Signed and sealed this 22nd day of April 1975.

(SEAL)
Attest:

RUTH C. MASON
Attesting Officer

C. MARSHALL DANN
Commissioner of Patents
and Trademarks